United States Patent [19]
Kang et al.

[11] Patent Number: 5,963,836
[45] Date of Patent: Oct. 5, 1999

[54] METHODS FOR MINIMIZING AS-DEPOSITED STRESS IN TUNGSTEN SILICIDE FILMS

[75] Inventors: Sien G. Kang, Tracy; John Y. Adachi, Los Altos; David Badt, Sunnyvale; Edward L. Sill, San Jose; Hector Velasco, Milpitas, all of Calif.

[73] Assignee: Genus, Inc., Sunnyvale, Calif.

[21] Appl. No.: 08/759,868

[22] Filed: Dec. 3, 1996

[51] Int. Cl.⁶ ................................................... H01L 21/44
[52] U.S. Cl. .......................... 438/682; 438/680; 438/683; 438/648
[58] Field of Search ................................ 438/685, 682, 438/683, 641, 644, 648, 653, 677, 680; 118/725, 728, 715, 719

[56] References Cited

U.S. PATENT DOCUMENTS

| | | | |
|---|---|---|---|
| 4,956,204 | 9/1990 | Amazawa et al. | 427/248.1 |
| 5,240,505 | 8/1993 | Iwasaki et al. | 118/719 |
| 5,391,394 | 2/1995 | Hansen | 427/124 |
| 5,429,991 | 7/1995 | Iwasaki et al. | 438/653 |
| 5,434,110 | 7/1995 | Foster et al. | 437/245 |
| 5,447,570 | 9/1995 | Schmitz et al. | 118/728 |
| 5,482,759 | 1/1996 | Telford et al. | 427/578 |
| 5,686,355 | 11/1997 | Sumi et al. | 437/192 |

*Primary Examiner*—Charles Bowers
*Assistant Examiner*—Renee' R. Berry
*Attorney, Agent, or Firm*—Donald R. Boys

[57] ABSTRACT

Processing of substrates in a CVD reactor system wherein tungsten silicide is deposited is accomplished with preflow and postflow of reducing gases before and after deposition steps to ensure that tungsten-rich film is not deposited at the interface of the tungsten silicide film to the substrates or on the tungsten silicide film at the end of deposition processing. For systems having a remote gas injection and flow control system connected by a gas supply manifold to a CVD reactor chamber, an isolation valve is provided in the gas supply manifold, and the valve is held closed during at least a portion of time between deposition sequences.

11 Claims, 3 Drawing Sheets

METHODS FOR MINIMIZING AS-DEPOSITED STRESS IN TUNGSTEN SILICIDE FILMS

FIELD OF THE INVENTION

The present invention is in the area of methods and apparatus for processing wafers as a step in manufacturing integrated circuits (ICs), and pertains in particular to chemical vapor deposition (CVD) and plasma-enhanced chemical vapor deposition (PECVD) of transitional metals with silicon.

BACKGROUND OF THE INVENTION

Manufacturing of integrated circuits is historically a procedure of forming thin films and layers of various materials on wafers of base semiconductor material, and then selectively removing areas of the films to provide structures and circuitry. Doped silicon is a typical base wafer material, and in various process schemes, metal layers are formed on the doped silicon or on polysilicon or silicon oxide formed from the base material.

It is well-known in the art that there are certain properties of thin films that are more-or-less universally desirable. For example, it is desirable that applied films in semiconductor manufacturing, and generally in all sorts of film deposition; exhibit good adhesion to the surfaces they are applied upon. Another generally desirable characteristic, related to adhesion, is low as-deposited film stress. Although many films are annealed after deposition, the temperature and time required for annealing, and even the stress level to which a film may be reduced by annealing, may be strongly effected by the as-deposited film stress. Also, highly stressed films may deform and separate from the underlying layers before annealing can be effectively accomplished.

There are a number of well-developed technologies for deposition of materials in the ultra-thin layers required for IC fabrication schemes. The deposition techniques can be roughly classed as either physical vapor deposition (PVD) or Chemical Vapor Deposition (CVD) techniques. PVD processes include such processes as evaporation and re-condensation, wherein a material, typically a metal, is heated to a temperature at which the metal melts and vaporizes. The metal then condenses on surfaces generally in line-of-sight of the evaporation, forming a film.

Another PVD process is the well-known sputtering process, wherein a plasma of usually an inert gas is formed near a target material, and the target is biased to attract ions from the plasma to bombard the target. Atoms of the target material are dislodged by momentum transfer, and form an atomic flux of particles which coalesce on surrounding surfaces generally in line-of-sight of the target surface eroded by the sputtering process.

PVD processes have distinct advantages for some processes, such as high rate of deposition, and relatively simple coating apparatus. There are drawbacks as well, notably an inherent inability to provide adequate step coverage. That is, on surfaces having concavities as a result of previous coating and etching steps, PVD processes are heir to shadowing effects resulting in local non-uniformity of coating thickness. This problem has grown in importance as device density has increased and device geometry has diminished in size.

CVD processes comprise deposition from gases injected into a processing chamber, typically at very low pressure compared to atmospheric pressure. In these processes, one or more materials that are components of one or more gaseous precursors are caused to deposit on a substrate through chemical decomposition and/or recombination. Energy input by heat, sometimes augmented by plasma power are used to drive the chemical reactions that result in deposition.

Many materials may be deposited by CVD techniques, but the field is limited to those materials which may be introduced to a chamber as either a gas or a vapor. For example, a film of metallic tungsten may be deposited on a heated substrate surface by flowing tungsten hexafluoride ($WF_6$) to the surface in conjunction with a reducing gas, such a hydrogen. The resulting chemical reaction at a hot substrate surface reduces the $WF_6$, leaving a film of tungsten on the substrate and producing HF gas. Tungsten is used in semiconductor manufacturing as a contact film between transistor gates and interconnect traces.

In other well-known CVD processes silicon is provided as silane ($SiH_4$), disilane ($Si_2H_6$), or as dichlorosilane ($SiH_2Cl_2$) along with $WF_6$ to produce a film of tungsten silicide ($W_xSi_y$), which is a preferred film for contacts. The present invention has particular relevance to tungsten silicide films.

Low resistivity for electrical contacts at devices in semiconductor circuitry, and low film stress are both highly desirable characteristics for CVD deposited tungsten silicide films. Unfortunately, deposition conditions that promote low resistivity do not necessarily promote low stress, and vice-versa.

Resistivity and film stress before and after anneal depend on a number of variables, such as hearth and substrate temperature in a CVD reactor, plasma power (if used), silicon-to-tungsten ratio in the as-deposited film, chamber pressure during deposition, flow rates and ratio of gases during deposition steps, anneal time and temperature, and much more. These variables and the results of varying them are relatively well known in the art after several years of depositing tungsten silicide, and competitive edges in general are typically accomplished by different manufacturers of CVD reactors and by manufacturers of integrated circuits (ICs), which manufacturers use the CVD reactors, by developing methods and hardware for precisely controlling the variables.

Still, even though the variables are well-known and much experience has been gained by many with skill in the art, and many patents have been awarded, there are still subtle interdependencies among variables that remain to be thoroughly understood, and causes and effects that are perhaps not as well understood as previously supposed in the art. The present inventors believe they have discovered more than one such circumstance in the deposition of tungsten silicide, and have developed methods and apparatus to provide more desirable films under more favorable circumstances than were previously thought to be possible.

The process effects that the present inventors have discovered and documented, and the steps taken and the apparatus developed as a result, providing new and better equipment and processes, are detailed in full below, forming the basis of the embodiments of the present invention.

SUMMARY OF THE INVENTION

In a preferred embodiment of the present invention a method is provided for depositing a tungsten silicide film on a substrate in a CVD reactor chamber, comprising steps of (a) with the CVD reactor chamber closed and the substrate in position and heated, establishing a preflow of reducer gas to the reactor chamber, thereby preventing preformation of tungsten-rich film on the substrate before planned process steps begin; (b) introducing $WF_6$ and other process gases into the reactor chamber and accomplishing deposition of the tungsten silicide film on the substrate by the planned process steps; and (c) ceasing flow of the process gases to stop the deposition of the tungsten silicide film.

In an alternative embodiment a step for postflowing the reducer gas after the step for ceasing flow of the process gases to stop the deposition of the tungsten silicide film prevents post-formation of tungsten-rich film on the tungsten silicide film after the planned process steps are complete. In some embodiments the CVD reactor chamber is connected by one or more manifolds to a gas injection and flow control subsystem, and practice of the invention further comprises closing an isolation valve between the CVD reactor chamber and the gas injection and flow control subsystem for substantially all of the time between the end of deposition steps for one wafer and the beginning of deposition steps on another wafer. The various embodiments of the invention have particular application in processes for manufacturing integrated circuits.

In various embodiments of the methods taught preflow, postflow, and isolation may be used individually or in any combination as circumstances may determine.

In one aspect of the invention a CVD reactor system is provided comprising: a CVD reactor chamber having a hearth for heating a substrate to be coated; a gas injection and flow control system connected to the CVD reactor chamber by a gas supply manifold; and an isolation valve positioned to isolate the CVD reactor chamber from the gas injection and flow control system. The CVD depositions are performed on a substrate for a first period of time, wherein deposition is suspended while substrates are transferred to and from the CVD reactor chamber during a second period of time, and the isolation valve is held closed, isolating the CVD reactor chamber from the gas injection and flow control system during a portion of the second period of time.

DESCRIPTION OF THE PREFERRED EMBODIMENTS

Figure 1:
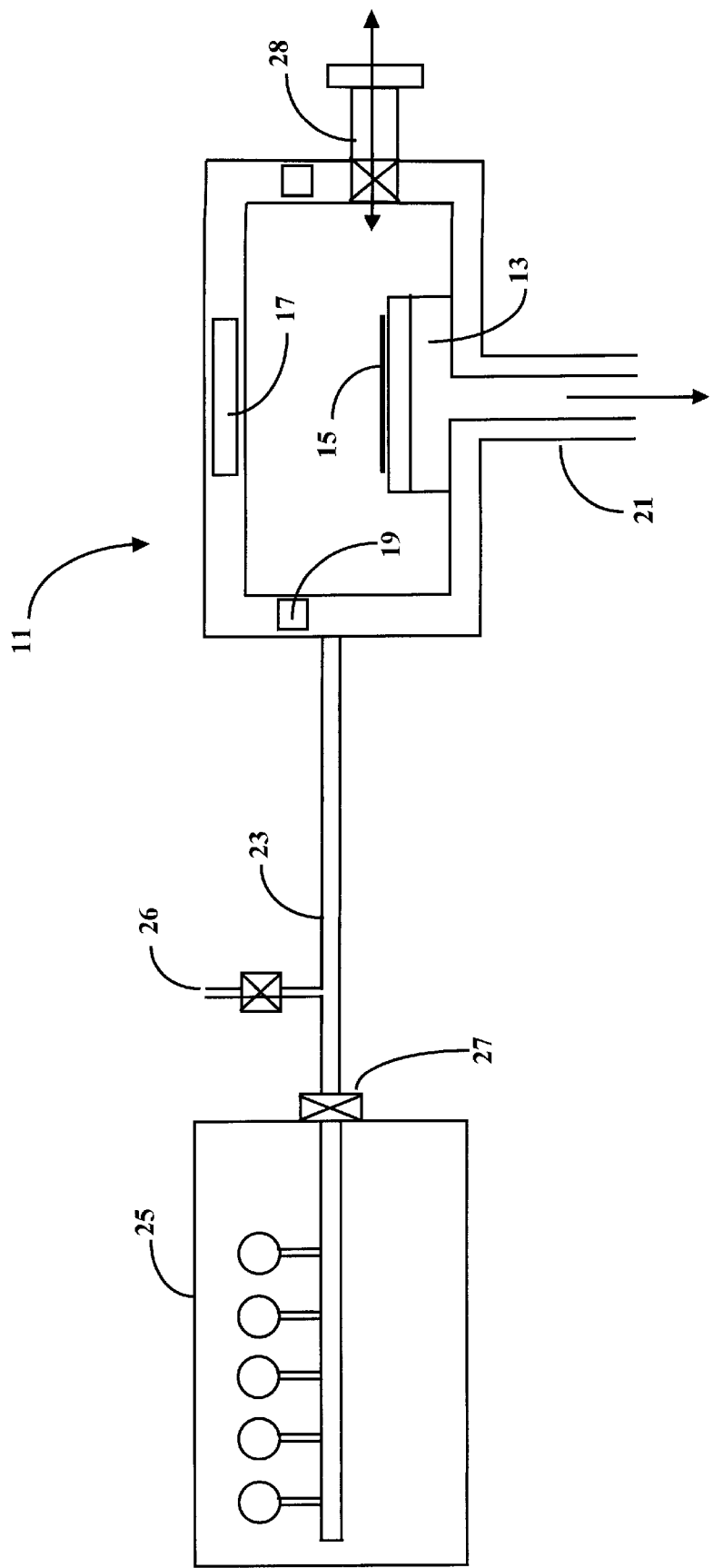
FIG. 1 is an idealized elevation section view of a single wafer CVD reactor and a gas supply system according to an embodiment of the present invention.

It is well-known that there are several commonalties in CVD processes. For example, virtually all commercial CVD processes, including those for preparing films of tungsten silicide, are performed at a total pressure in the processing chamber well below atmospheric pressure. Typically a chamber that is adapted to be hermetically sealed is employed, and fitted with apparatus for heating substrates to be coated. Apparatus is provided as well for flowing process gases into the chamber while substrates are present and heated, so films are deposited.

In some processes energy is added by plasma enhancement as well as by heat, and apparatus for striking and maintaining a plasma is provided, and certain gases may be added to the process mix, such as inert Argon, for example, to enhance the provision of a plasma.

Some CVD reactors are batch reactors, in which several substrates are processed at the same time, and some are single-substrate reactors, which are typically used with machines called cluster tools, wherein substrates (also termed wafers or platters) are moved sequentially through several single-substrate chambers, which are isolated during process steps.

In either the single substrate chambers or the batch systems, between process cycles the CVD reactor chamber is pumped to a relatively high vacuum level, that is, to a much lower pressure than during processing. For example, in a typical deposition process the pressure in the processing chamber may be at 500 milliTorr, while during pumpout the pressure will be reduced to below 10 milliTorr. The purpose of such a pump out is to remove process gases from the chamber before a wafer (or wafers) is removed after processing. This ensures (it has been strongly believed) that the deposition process is terminated, and allows residual gases to be pumped away before a new wafer (or wafers) is processed.

A typical process cycle, somewhat simplified but applicable to both batch reactors and single-substrate reactors, and assuming a starting point just at the completion of a deposition, comprises steps of: (1) discontinue flow of process gases to the reactor (2) pump out chamber to high vacuum; (3) open transfer valve to air lock or transfer volume under vacuum; (4) remove processed wafer or wafers; (5) insert new, unprocessed wafer or wafers; (6) follow processing steps, comprising establishing flow of process gases for predetermined periods of time to accomplish process. If pumping speed is not variable, pumpout (step 2) occurs simply because gas flow is interrupted in step 1. More often, however, one or more throttle valves in vacuum pumping lines may be opened after gas flow is stopped to decrease the time needed for pumpout.

Typically in this generic process flow, heat to a hearth upon which wafers to be coated are rested (to heat the wafers), is continued during the pumpout phase. This is true for several reasons, among them that precise temperature control is considered critical, and turning power on and off to the hearth would cause hard-to-control temperature perturbations. Another is that the hearth typically has considerable thermal mass, and temperature can therefore be changed only relatively slowly.

From this point in the specification descriptions are based on a single wafer reactor of a type meant to be adapted to a cluster tool machine, even though many embodiments of the invention pertain and apply to CVD systems of other sorts. It is assumed that the descriptions are also applicable to batch reactors. In cases where this is not so, specific reference is made to the reactor type.

Consequent to the generic process sequence listed above, a wafer for which processing is finished by virtue of the deposition steps for tungsten silicide (in this instance) being completed, is kept at processing temperature during pumpout, before the valve to the transfer volume is opened. Moreover, a new wafer brought into the reactor from the transfer volume and placed on the hearth is heated to processing temperature before process gases are flowed into the reactor.

The present inventors have discovered that some of the assumptions so far relied upon by developers and researchers are not entirely correct. Workers in the art have assumed, for example, that deposition is terminated by discontinuing flow of process gases to a CVD reactor and pumping the chamber to a pressure level much lower than the processing pressure. The inventors note, as well, that there is no such thing as a perfect vacuum. Vacuum levels are relative. Moreover, pumping speed is always finite, so pumpout is done over a time period. Further, a wafer for which process is ostensibly finished is still on the hearth and heated as pumpout is accomplished.

The present inventors are aware also that $WF_6$ is a relatively wet gas, in the sense that it tends to adhere to the inner surfaces of manifolds, chamber walls, and other surfaces. The present inventors theorized therefore, that even if flow of process gases were to be suspended and pumping speed were to be increased to accomplish pumpout, there could be still sufficient $WF_6$ available in the process chamber to continue some deposition of tungsten or very tungsten-rich film on the wafer on the heated hearth. In this case a thin layer of tungsten-rich film could be deposited on the surface of a just-prepared tungsten silicide film, and if that were true, the thin tungsten-rich film (which might be pure tungsten) could measurably effect film characteristics, such as as-deposited resistivity and stress.

The present inventors have tested their theory and found it to be true, and the conventional wisdom to be flawed. Moreover, the same effect has been found at the beginning of a process cycle, after a new wafer is placed on a hearth in a processing chamber, and before process gases are flowed into the chamber. What actually takes place under certain conditions is that a thin, tungsten-rich film is formed on a wafer before planned processing commences, and another thin, tungsten-rich film is formed on the wafer after processing is thought by others to be complete.

For purposes of illustration of both prior art and the present invention, FIG. 1 is an idealized elevation cross section of a single-wafer CVD reactor according to an embodiment of the present invention. In FIG. 1 a single wafer CVD reaction chamber 11 includes a heated hearth 13 upon which a wafer 15 is placed for processing, a pumping port 21 through which gases are evacuated (this port in most instances may be throttled to control pumping speed), a transfer port 28 through which wafers are inserted to and removed from the reactor (usually to an intermediate area held at relatively high vacuum), and both a showerhead manifold 17 and a ring manifold 19 for injecting process gases into the CVD reactor. It will be apparent to those with skill in the art that this is a simplified illustration, and there are many conventional elements not shown.

CVD reactor 11 is connected by a gas supply manifold 23 to a gas injection unit 25, which includes gas reservoirs, valves, mass flow controllers, and the like for injecting and mixing gases to be supplied to reactor 11 to accomplish deposition processes. This manifolding is relatively complicated for a number of reasons, among them that some of the gases used are very toxic and must be kept remote from other equipment, and the fact that some gases can be premixed, and because of gas phase reactions other gases cannot be premixed.

Figure 2:
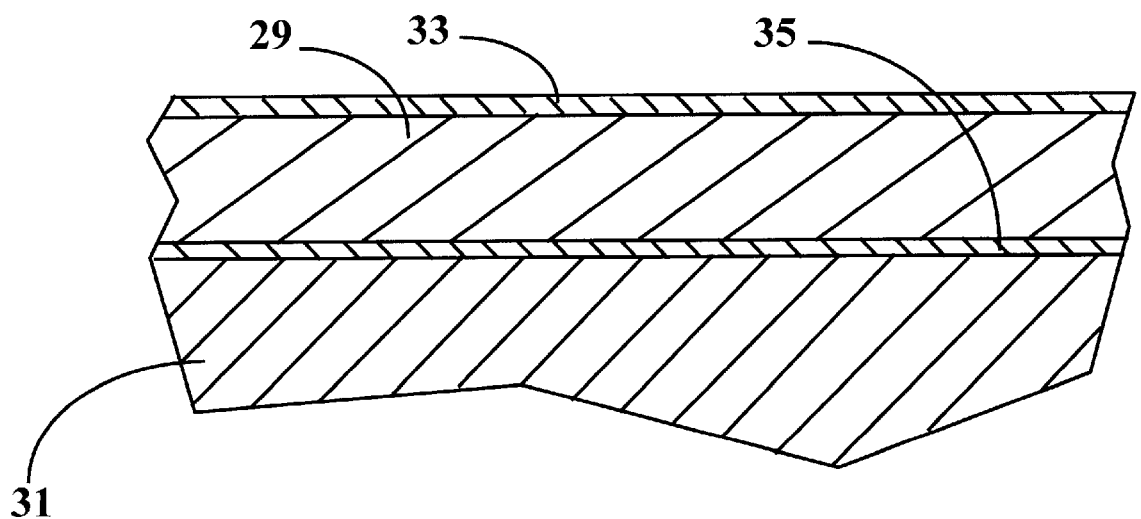
FIG. 2 is an idealized cross section of a tungsten silicide film on a substrate, illustrating a phenomenon discovered by the present inventors.

FIG. 2 is an idealized cross-section of a tungsten silicide film 29 as deposited in a CVD reactor on a substrate 31. The inventors have discovered that in many, if not most commercial processes a very thin layer (33, 35) (typically a few atomic diameters thick, but varying in thickness from case to case) of pure tungsten or tungsten-rich film is found on both sides of the intentionally deposited tungsten silicide layer 29 for wafers processed in commercially-available reactors. The inventors also discovered the tungsten-rich films were in some cases more prominent than others, and the inventors were successful in isolating the causative factors. Further, the tungsten-rich films have been correlated to as-deposited stress in particular. The presence of these tungsten-rich films, either on the substrate side or the open side of the tungsten silicide film, or on both sides, has been demonstrated to measurably increase as-deposited stress.

By diligent experimental investigation the authors have isolated the sources of the tungsten-rich films on both sides of intentionally deposited films. The facts are these:

1. When a wafer is placed on a heated hearth prior to a process cycle, and the transfer door is closed, the wafer, being of small thermal mass compared to the hearth, heats rapidly to process temperature. Moreover, in reactors used with $WF_6$, the gas is still present in the supposedly pumped-out chamber at a finite partial pressure. This is because $WF_6$, like water vapor, clings to manifold and chamber surfaces and is only slowly volatilized and pumped away. This is a phenomenon known in the art as outgasing, and is well-known relative to, for example, water vapor. As a result of the presence of $WF_6$ and adequate wafer temperature, a thin layer of tungsten or very tungsten-rich film is deposited before planned deposition steps are initiated.

2. At the end of planned deposition steps, when process gases are shut off and pumpout is accomplished, $WF_6$ is again present by residual in the reactor, and by outgasing from surfaces in manifolds and the reactor chamber, and another thin tungsten-rich film is deposited on top of the intended tungsten silicide film.

3. If, in initiating the planned processing steps, $WF_6$ and the reducing gas (for example silane, disilane, dichlorosilane) are turned on at the same time, there is a finite possibility that a small amount of $WF_6$ will reach the wafer surface before the reducing gas, and the initial tungsten-rich film will be even more substantial.

4. If, at the end of the planned processing steps, $WF_6$ and the reducing gas are shut off at the same time, there is a finite possibility that $WF_6$ will remain in the chamber longer than the reducing gas, or that the ratio of $WF_6$ to the reducing gas will be much higher for a time than expected, and the post-process tungsten-rich film will be even more substantial.

The present inventors have, by film analysis techniques and experiment, verified the presence of the pre- and post-process tungsten-rich films, and the effect of these unwanted films on as-deposited film characteristics. Methods and apparatus for avoiding these tungsten-rich layers and thereby enhancing as-deposited film characteristics are presented below.

The system of FIG. 1, described in some respects above, has, in addition to those elements previously discussed, a shut-off valve 27 in the gas supply line after the injection and mass flow equipment. In some embodiments there is also a valved inlet 26 downstream from the isolation valve 27. Because the manifolding within the gas injection unit 25 is of necessity rather lengthy and complicated, there is considerable surface area upon which $WF_6$ may adsorb. By closing valve 27 after process is complete, and keeping it closed during all of the time of pump out and wafer transfer through port 28, the inventors have discovered that the pre- and post process tungsten-rich films are minimized. The as-deposited stress level for films deposited under conditions wherein valve 27 is used as described is found to be significantly less than when the valve is used. For example, in a process for depositing a tungsten silicide film using dichlorosilane as the reducing gas, the as-deposited stress measured in a system wherein a shut-off valve such as valve 27 is not used was measured as >1.4E10 dynes/cm², while in a similar system wherein a shut-off valve such as valve 27 is used, the as-deposited stress was measured as <1E10 dynes/cm$^2$.

Figure 3:
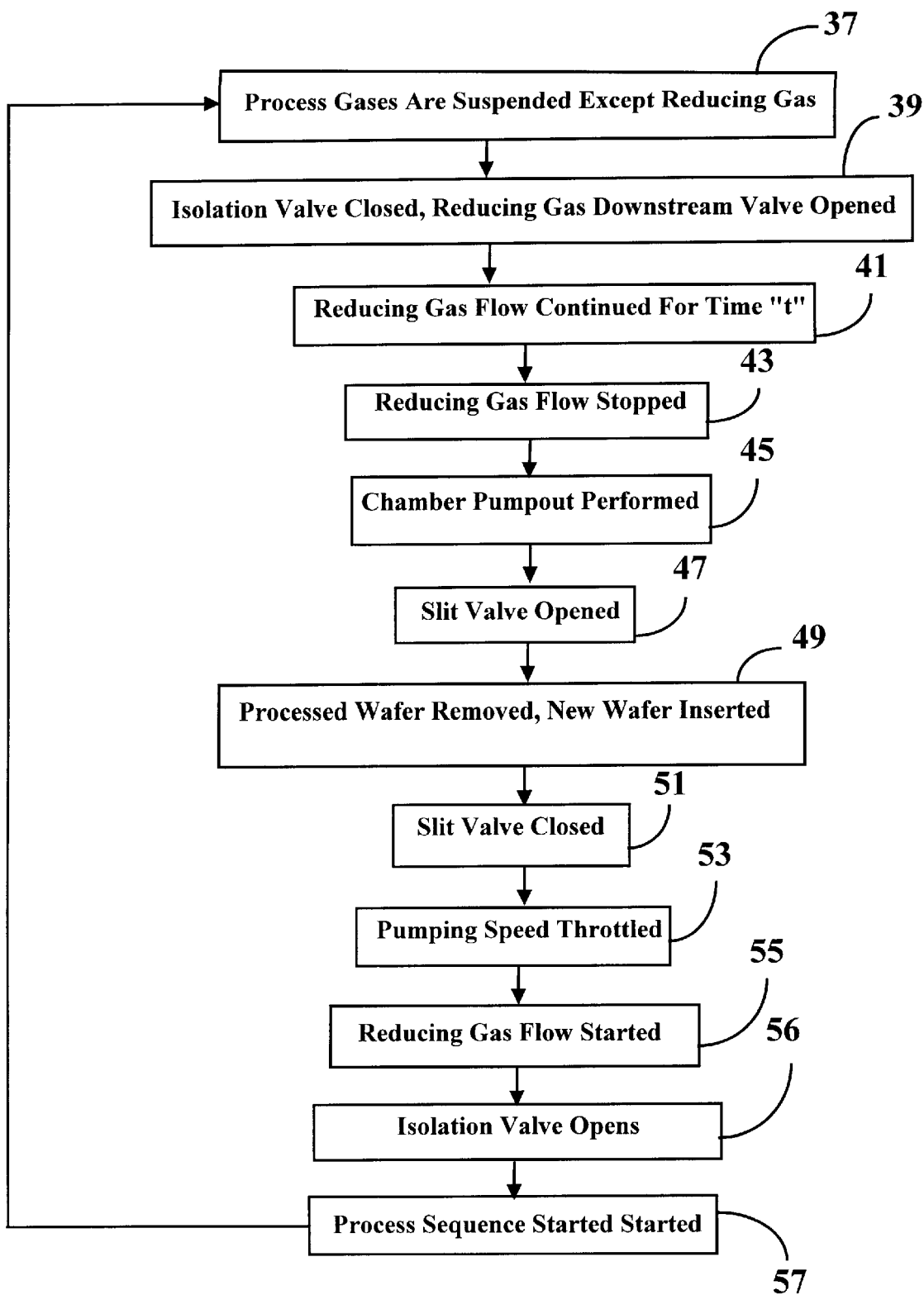
FIG. 3 is a process flow diagram depicting steps in practice of an embodiment of the present invention.

FIG. 3 is a flow diagram illustrating practice of the present invention in combined embodiments. The steps in a cycle may be described from any convenient point through an entire cycle, as the cycle sequence is repeated. For convenience description of FIG. 3 begins at the point (step 37) where planned process steps are complete. At this point gas flow is suspended, except for reducing gas. Reducing gas flow is continued to ensure a high ratio of reducing gas to any residual WF$_6$ in the reactor, ensuring that any continued deposition is not tungsten-rich.

In some cases a downstream reducing gas valved inlet (see element 26 of FIG. 1) is provided, in which case isolation valve 27 is closed and valved inlet 26 is opened. This circumstance is represented by step 39 of FIG. 3. Reducing gas post-flow is continued for a period of time, represented by step 41.

At step 43 reducing gas post-flow is stopped and at step 45 chamber pumpout is performed. At step 47 the slit transfer valve (element number 28, FIG. 1) is opened, and the finished wafer is removed and a new wafer is inserted at step 49. The slit valve is closed again after wafer transfer at step 51. Pumping speed is then throttled (step 53) and reducing gas pre-flow is immediately started at step 55. At step 56 isolation valve 27 is opened again, and at step 57 process gas flow is started, and may continue at different levels and different gases through all of the conventional process steps established until the desired film is formed. Process flow then returns to step 37 where process gas flow is again suspended at the end of processing.

Preflow of reducing gas, post flow of reducing gas, and use of the isolation valve to minimize outgasing from manifolds into the CVD reactor have all been demonstrated by the inventors to effect as-deposited film stress.

It is not only film stress that is affected in the practice of embodiments of the invention. The inventors have also found that the heretofore unsuspected presence of WF$_6$ without adequate reducer gas at the beginning and end of conventional processing is responsible for a significant proportion of wormhole formation, as the WF$_6$ is reduced by the silicon or polysilicon materials on the wafer. Moreover, practicing the present invention, as it reduces or eliminates the high tungsten-content films found to be present at the interfaces of tungsten silicide films, also lessens deposition of high-stress tungsten-rich material on the walls of CVD reactor chambers, providing a cleaner process which can be repeated more often before chamber service is required.

Another effect of the presence of pre-and-post tungsten-rich films is formation of voids during oxidation processes that follow the deposition steps discussed above. During such oxidation processes excess silicon atoms in the tungsten silicide film diffuse through the silicide film to the surface, to take part in the oxidation reaction. If there is inadequate silicon available for oxidation, which is the case if tungsten-rich tungsten silicide is present either at the surface, or at the polysilicon/silicide interface, then there is a tendency for 1) void formation or 2) tungsten oxide formation.

Voids are nucleated at the interface of the polysilicon/silicide when the only available source of silicon for the oxidation process is the underlying polysilicon. As silicon from the poysilicon is transported to the surface through defects or pinholes in native oxide present on the polysilicon, voids are created.

If the oxide at the polysilicon/silicide interface is intact and of a certain thickness which prevents silicon difflusion from the polysilicon, then there is a tendency for the tungsten in the tungsten silicide film to form tungsten oxide during the oxidation process. Tungsten oxides are unstable and volatile, and often result in delamination of the tungsten silicide film.

Either case described above can be prevented by avoiding deposition of a tungsten-rich film after deposition of tungsten silicide. Even more effective is a process wherein a silicon-rich outer surface layer of tungsten silicide is deposited, wherein the excess silicon content matches or exceeds that required by the oxidation process. For example, oxidizing silicon at 850 degrees C. for 30 minutes requires approximately 5E15 atoms/cc of excess silicon in the outer film layer. All of the silicon required for the oxidation process is locally available in this scheme, and there is no driving force to cause silicon atoms to migrate from the underlying polysilicon or tungsten atoms from the tungsten silicide film.

In the art to date the problem of void formation has been addressed by deposition in a separate process of polysilicon directly onto a previously deposited tungsten silicon layer. It is also known in the art to deposit in-situ a film of polysilicon upon a layer of tungsten silicide to avoid void formation. In an embodiment of the present invention, however, in-situ steps are taken to ensure that the last portion of a deposited tungsten silicide film is, in one aspect, not tungsten-rich, and, in another aspect is intentionally silicon-rich.

In the first case, to ensure that the outer layer of a deposited tungsten-silicide film is not tungsten-rich, the steps described above relative to FIG. 3 are followed, wherein one or more of the steps of pre-flow of reducer gas, post flow of reducer gas, and use of an isolation valve are followed. In the second case, to add further assurance of avoiding void formation in subsequent oxidation processing, a silicon-rich surface to the tungsten silicide film is provided by increasing the flow of reducer gas in the last portion of the conventional deposition of tungsten silicide. For example, assuming a ratio of the silicon-bearing gas to WF$_6$ for conventional processing for a time t, in an embodiment of the present invention this ratio is increased during a final portion of time t, perhaps 10%, to ensure that the final portion of the deposited film will be silicon-rich.

Further, the inventors have found particular advantage in practice of the invention in conjunction with formation of tungsten silicide films using dichlorosilane. Manufacturers have found it desirable to decrease anneal time and temperature as much as practical in large part because vertical and lateral device dimensions have significantly decreased with increases in device density in chip design. It is known that after-anneal resistivity decreases to a lesser extent as anneal time and temperature are reduced, and that after anneal resistivity is a function of as-deposited resistivity and silicon to tungsten ratio (Si:W). Unfortunately, however, the same steps that reduce as-deposited resistivity produce higher as-deposited stress, requiring higher anneal temperature and longer anneal time.

By practice of the present invention, Si:W may be reduced and other variables managed to lower as-deposited resistivity while as-deposited stress is also kept low. Low as-deposited resistivity is provided by reducing chamber total pressure to about 250 milliTorr, which provides a low Si:W. In the anneal, as a consequence, less Si is required to diffuse out of the tungsten silicide film, therefore a lower than usual temperature is required to complete the anneal.

It will be apparent to those with skill in the art that there are many alterations and alternatives to the embodiments described above, without departing from the spirit and scope of the invention. For example, there are many ways isolation valves may be implemented and positioned other than that depicted above. Moreover, there are several ways reducing gas pre-flow and post-flow may be provided. The lengths of time for such flows of reducing gas will also vary depending on a number of circumstances, mostly related to particular equipment configuration. There are similarly many other alterations that might be made. The invention is limited only by the claims which follow.

What is claimed is:

1. A method for depositing a tungsten silicide film on a substrate in a CVD reactor chamber, comprising steps of:
   (a) with the CVD reactor chamber closed and the substrate placed in coating position, establishing a preflow of silicon-bearing reducer gas to the reactor chamber before the substrate attains coating temperature, thereby preventing preformation of tungsten-rich film on the substrate before planned process steps begin; and
   (b) introducing $WF_6$ and other process gases into the reactor chamber after the substrate attains coating temperature substantially without interrupting the preflow of silicon-bearing reducer gas.

2. The method of claim 1 further comprising a step for stopping the deposition by stopping flow of process gases except for a postflow of the silicon-bearing reducer gas, maintained while the wafer is still in the reactor chamber at deposition temperature, thereby preventing post-formation of tungsten-rich film on the tungsten silicide film.

3. The method of claim 1 wherein the CVD reactor chamber is used for repeated process cycles wherein one or more wafers are coated in one cycle, and a different wafer or wafers are coated in subsequent cycles, and the CVD reactor chamber is connected by a manifold to a gas injection and flow control subsystem including a source of $WF_6$, and further comprising a step for closing an isolation valve in the manifold between the CVD reactor chamber and the gas injection and flow control subsystem for substantially all of the time between the end of one deposition cycle and the beginning of a subsequent deposition cycle.

4. The method of claim 1 wherein the substrate is a semiconductor wafer in a phase of integrated circuit manufacture.

5. A method for depositing a tungsten silicide film on a substrate in a CVD reactor chamber, comprising steps of:
   (a) introducing $WF_6$ and silicon-bearing reducer gas into the reactor chamber to accomplish deposition of the tungsten silicide film on the substrate;
   (b) ceasing flow of process gases other than the silicon-bearing reducing gas to stop the deposition of the tungsten silicide film; and
   (c) continuing flow of the silicon-bearing reducing gas for a period of time after the process gas flow is stopped, thereby preventing postformation of tungsten-rich film on the substrate.

6. The method of claim 5 wherein the CVD reactor chamber is connected by a manifold to a gas injection and flow control subsystem, and further comprising a step for closing an isolation valve in the manifold between the CVD reactor chamber and the gas injection and flow control subsystem for substantially all of the time between the end of deposition steps for one wafer and the beginning of deposition steps on another wafer.

7. The method of claim 5 wherein the substrate is a semiconductor wafer in a phase of integrated circuit manufacture.

8. A method for minimizing unwanted tungsten-rich deposition on a substrate in a CVD reactor chamber having a gas injection and flow control subsystem providing tungsten hexafluoride gas through a first shut-off valve and flow controller remote from the reactor chamber, and connected by a substantially elongated gas supply manifold to the CVD reactor chamber such that substantial manifold wall surface area is exposed to the reactor chamber, the method comprising steps of:
   (a) providing a second shut-off valve in the substantially-elongated gas supply manifold; and
   (b) closing the second shut-off valve for substantially all of the time between the end of deposition steps for one wafer and the beginning of deposition steps on another wafer, thereby isolating the CVD reactor chamber from the substantial wall surface area in the area between the first and second shut-off valves, and preventing outgasing of tungsten hexafluoride gas from the isolated wall surface area into the reactor chamber.

9. The method of claim 8 further comprising a step for preflowing a reducer gas to the CVD reactor chamber before commencing deposition steps, thereby preventing preformation of tungsten-rich film on the substrate before planned process steps begin.

10. The method of claim 8 further comprising a step for postflowing, without interruption, a reducer gas to the CVD reactor chamber after completing deposition steps, thereby preventing postformation of tungsten-rich film on the substrate after planned process steps are complete and before the substrate is removed from the CVD reactor chamber.

11. A method for depositing a tungsten silicide film on a substrate in a CVD reactor chamber, comprising steps of:
   (a) introducing $WF_6$ and reducer gas into the reactor chamber for a first period of time at a first ratio of reducer gas to $WF_6$ to accomplish deposition of the tungsten silicide film on the substrate; and
   (b) establishing a second ratio of reducer gas to $WF_6$ higher than the first ratio for a second period of time no more than ten percent of the first period of time, ensuring thereby a silicon-rich layer on the tungsten silicide film.

* * * * *